(12) United States Patent
De Jongh

(10) Patent No.: US 6,992,752 B2
(45) Date of Patent: Jan. 31, 2006

(54) LITHOGRAPHIC PROJECTION APPARATUS, COMPUTER PROGRAM FOR CONTROL THEREOF, AND DEVICE MANUFACTURING METHOD

(75) Inventor: Robertus Johannes Marinus De Jongh, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 240 days.

(21) Appl. No.: 10/360,989

(22) Filed: Feb. 10, 2003

(65) Prior Publication Data

US 2003/0180639 A1 Sep. 25, 2003

(30) Foreign Application Priority Data

Feb. 12, 2002 (EP) .............................. 02250966

(51) Int. Cl.
  *G03B 27/42* (2006.01)
  *G03B 27/58* (2006.01)
  *G03F 9/00* (2006.01)

(52) U.S. Cl. ............................... 355/53; 355/72; 430/30
(58) Field of Classification Search ................... 355/53, 355/72, 75, 77; 430/22, 30, 296, 311
See application file for complete search history.

(56) References Cited

U.S. PATENT DOCUMENTS

| 5,461,237 | A | | 10/1995 | Wakamoto et al. | |
| 6,359,679 | B1 | * | 3/2002 | Ito et al. | 355/75 |
| 6,388,733 | B1 | * | 5/2002 | Hayashi | 355/53 |
| 6,449,030 | B1 | * | 9/2002 | Kwan | 355/72 |
| 6,603,531 | B1 | * | 8/2003 | Binnard | 355/53 |
| 6,757,053 | B1 | * | 6/2004 | Hazelton et al. | 355/72 |
| 2001/0002303 | A1 | | 5/2001 | Yuan | |

FOREIGN PATENT DOCUMENTS

| EP | 0 833 208 A2 | 4/1998 |
| EP | 0 848 299 A2 | 6/1998 |
| EP | 0 833 208 A3 | 11/1999 |
| EP | 0 848 299 A3 | 12/1999 |

* cited by examiner

*Primary Examiner*—Alan Mathews
(74) *Attorney, Agent, or Firm*—Pillsbury Winthrop Shaw Pittman LLP

(57) ABSTRACT

In a lithographic projection apparatus, modified control of a moveable component within the apparatus is provided to improve control of the position and velocity of a point on the component that is set apart from the center of mass of the component. The force required to provide the center of mass of the component with the acceleration required for the point on the component is determined. The force in a given direction is corrected by an amount proportional to the product of the velocity of the point in an orthogonal direction and the angular velocity about an axis perpendicular to the two orthogonal directions.

22 Claims, 2 Drawing Sheets

LITHOGRAPHIC PROJECTION APPARATUS, COMPUTER PROGRAM FOR CONTROL THEREOF, AND DEVICE MANUFACTURING METHOD

BACKGROUND OF THE INVENTION

1. Field of the Invention

The present invention relates to a lithographic projection apparatus, a computer program for control thereof, and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift; as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from United States Patents U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

The position and movement of a variety of moveable components within a lithographic apparatus must be accurately controlled. In many cases movement and control may be required in six degrees of freedom (linearly in three orthogonal directions and rotationally about three orthogonal axes). In a step-and-scan apparatus for example, the mask table and the substrate table must be scanned, e.g. in the Y (scanning) direction, underneath the projection beam and the projection system, respectively. At each instant the position and velocity of the mask table and the substrate table must be accurately controlled. For example, it is desired that the mask table's position within the plane of the mask (in an X-Y plane substantially perpendicular to the projection beam) is accurate to prevent, for example, overlay errors. It is also desired that the position of the mask table in the Z direction (parallel to the projection beam) is accurate to ensure that the image is correctly focused. Any rotations of the mask table, either about an axis parallel to the projection beam or about an axis in the plane of the mask will also produce imaging errors.

To effect the control required for the mask table or the substrate, an actuator system capable of providing controlled linear forces, acting in straight lines, in at least two mutually perpendicular directions and a torque force about an axis perpendicular to the direction of the two linear forces is provided. Preferably the actuator system is capable of providing linear forces in three mutually perpendicular directions and torque forces about axes parallel to these directions. The forces linearly and rotationally accelerate the mask pattern or the substrate, as required, and therefore, using an appropriate controller it is possible to control the position and velocity of the object in six degrees of freedom. The actuator system may, for example, be comprised of a plurality of individual actuators combined with a gravity compensator to bear the weight of the mask table or substrate table. Alternatively, the actuator system may be a planar motor (for an explanation of planar motors, see, for example, WO 01/18944 A1) which provides all of the forces required to control the substrate or mask table.

Conventional control systems only control the position and velocity of the substrate table or mask table as a whole. Therefore the position and velocity of a point on the component may not be controlled as precisely as required.

SUMMARY OF THE INVENTION

It is an aspect of the present invention to provide a method of controlling a moveable component within a lithographic apparatus that compensates for the effect of rotational adjustments of the component on the linear position and velocity of a point on the component.

This and other aspects are achieved according to the present invention in a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material; effecting desired linear accelerations in first and second orthogonal directions and an angular acceleration about an axis perpendicular to the first and second directions on a point on a component; wherein effecting the desired linear and angular accelerations includes: determining the positioning forces required to effect the desired accelerations on the center of mass of the component; determining a corrective force, the corrective force being in the second orthogonal direction and having a magnitude proportional to the velocity in the first orthogonal direction of the point on the component and the angular velocity of the component about the axis perpendicular to the first and second orthogonal directions; and applying the sum of the positioning forces and the corrective force to the center of mass of the component Determining and applying the corrective force improves the control of the position and velocity of the region within the component by offsetting the effect on the point of interest, in the second orthogonal direction, of the combination of the linear movement in the first orthogonal direction and rotational movement, about the axis perpendicular to the first and second orthogonal directions, of the element as a whole. Without this compensation, the linear position and velocity of points on the component are altered when the component is rotated, reducing the accuracy of the position and velocity control of those regions of the component. This can be detrimental if, for example, the point on the component is the area on the patterning device or the substrate on which the projection beam or the patterned beam, respectively, impinge. The present invention therefore allows greater positional accuracy of the area of interest within a component.

Preferably the force provided in the second direction is modified by two further corrective forces. The first is proportional to the product of the angular acceleration of the component about the axis perpendicular to the first and second orthogonal directions and he distance in the first orthogonal direction between the center of mass of the component and the point on the component; the second is proportional to the product of the acceleration of the component in the first orthogonal direction and the angular displacement of the component about the axis perpendicular to the first and second orthogonal directions relative to a predetermined position.

These corrective forces further improve the accuracy with which the position and velocity of the point on the component can be controlled in comparison with merely controlling the position and velocity of the component as a whole, namely controlling the position and velocity of the center of mass of the component.

The present invention can be used to control the position and velocity of the mask table holding the patterning device and/or the substrate table holding the substrate. This is especially useful since in both cases the projection beam (or patterned beam) only impinges on a relatively small targeting region of the patterning device (or substrate). It is therefore desirable to be able to accurately control, in six degrees of freedom, the position and velocity of the targeting region rather than merely the patterning device (or substrate) as a whole.

According to a further aspect of the invention there is provided a computer program for controlling a lithographic projection apparatus, the computer program including first computer readable code for effecting desired linear accelerations in first and second orthogonal directions and an angular acceleration about an axis perpendicular to the first and second orthogonal directions on a point on a component; wherein the first computer readable code includes second computer readable code for: determining the positioning forces required to effect the desired accelerations on the center of mass of the component; determining a corrective force, the corrective force being in the second orthogonal direction and having a magnitude proportional to the velocity in the first orthogonal direction of the point on the component and the angular velocity of the component about the axis perpendicular to the first and second orthogonal directions; and controlling a system of actuators to apply the sum of the positioning forces and the corrective force to the center of mass of the component.

According to a yet further aspect of the present invention there is provided a lithographic projection apparatus including a radiation system constructed and arranged to provide a projection beam of radiation; a support structure constructed and arranged to support a patterning device, the patterning device constructed and arranged to pattern the projection beam according to a desired pattern; a substrate table constructed and arranged to hold a substrate; a projection system constructed and arranged to project the patterned beam onto a target portion of the substrate; a control unit that determines the required forces to effect required linear accelerations in first and second orthogonal directions and a required angular acceleration about an axis perpendicular to the first and second directions on a point on a moveable component within the apparatus; wherein the control system: determines the positioning forces required to effect the desired accelerations on the center of mass of the component; determines a corrective force, the corrective force being in the second direction and having a magnitude proportional to the velocity in the first direction of the point on the component and the angular velocity of the component about the axis perpendicular to the first and second directions; and determines the sum of the positioning force and the corrective force; and an actuator system, operatively connected to the control unit, constructed and arranged to apply the sum of forces to the center of mass of the component.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. n will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
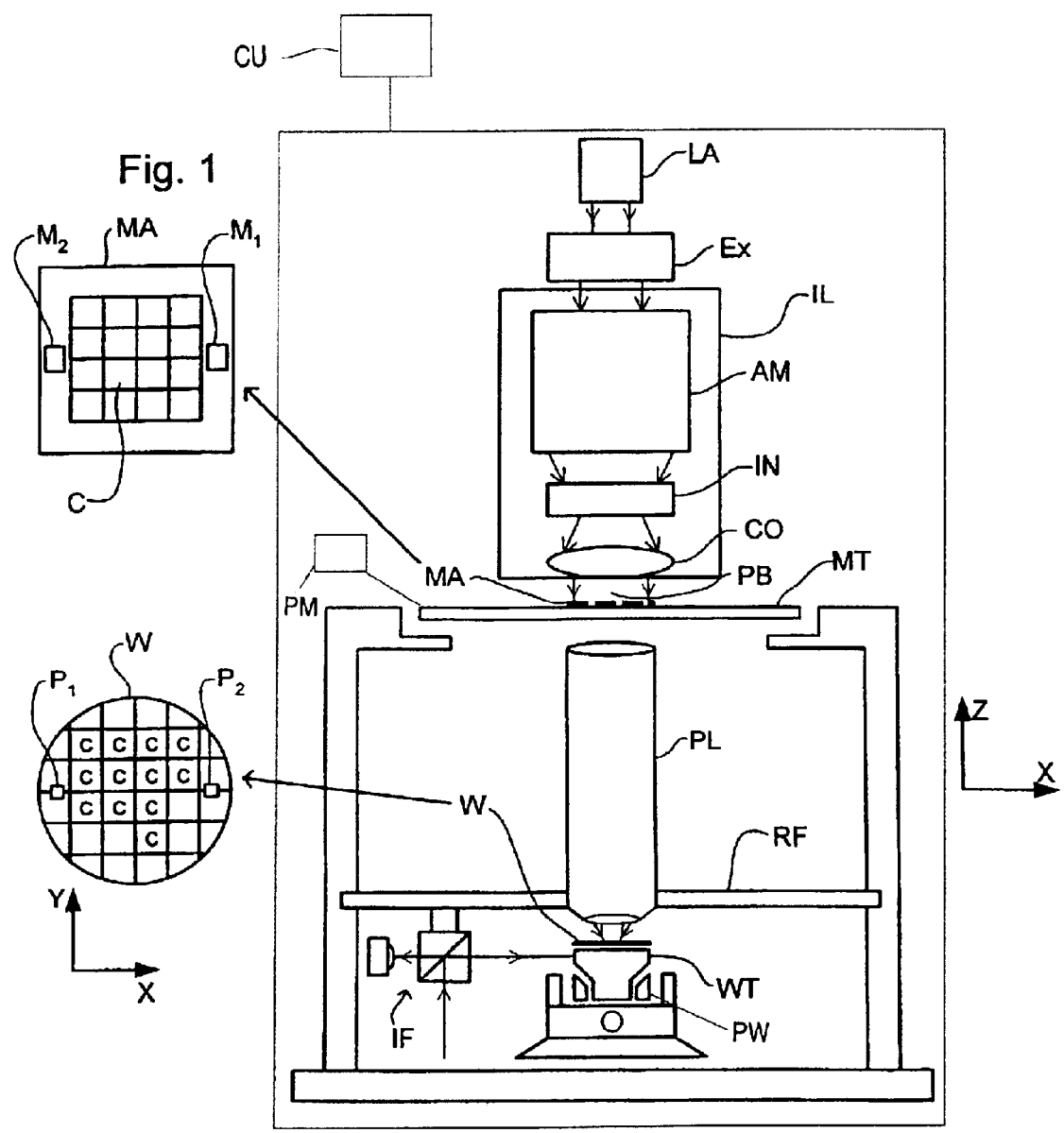
FIG. 1 depicts a lithographic projection apparatus according to an embodiment of the invention.

FIG. 1 schematically depicts a lithographic projection apparatus 1 according to an embodiment of the invention. The apparatus includes a radiation system Ex, IL constructed and arranged to supply a projection beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometic system IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As described above and shown in FIG. 2, when the apparatus 1 is used in scan mode the projection beam PB is focused on a point, or subsection, of the target portion C of the substrate W, referred to hereafter as the targeting region Cs. Correspondingly, the projection beam is only focused on a targeting region (not shown) of the target portion of the mask. As the substrate W is scanned in the direction S the position and orientation of the substrate W can be adjusted to take account of the imperfections of the substrate surface Ws. For convenience in the following description, the scanning direction S will be referred to as the Y direction, the direction parallel to the beam of radiation will be referred to as the Z direction and the direction perpendicular to the plane of FIG. 2 (i.e. perpendicular to both the Y and Z direction) will be referred to as the X direction.

Figure 2:
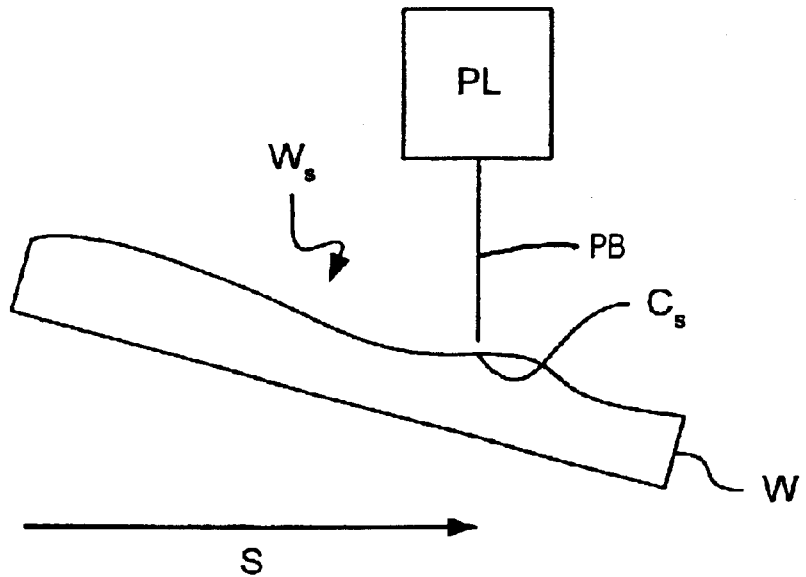
FIG. 2 depicts a substrate being scanned while being exposed with a projection beam.

The imperfections in the substrate surface Ws shown in FIG. 2 are not to scale but, in general, it may be desirable to rotate the substrate W about the X axis such that the surface of the targeting region Cs of the substrate W is substantially perpendicular to the projection beam PB. It may also be desirable to adjust the position of the substrate W in the Z direction to ensure that targeting region Cs is at substantially the correct focal length from the PL. Corresponding considerations apply when positioning the mask relative to the source LA. One should note that the targeting region Cs on the substrate W is not fixed with respect to the substrate W. As the substrate W is scanned underneath the projection beam PB, the targeting region Cs moves along the surface Ws of the substrate W.

The determination of the surface topography (and hence the required adjustments) of the substrate table or mask table may be determined in advance of the scanning during a so-called "pre-scan stage" or it may be determined as the scan proceeds ("on the fly"). Although not shown in FIG. 2, the position of the substrate table or mask table may also be adjusted by rotations about the Y axis and about the Z axis. Finally, corrections may also be required in the X direction.

Figure 3:
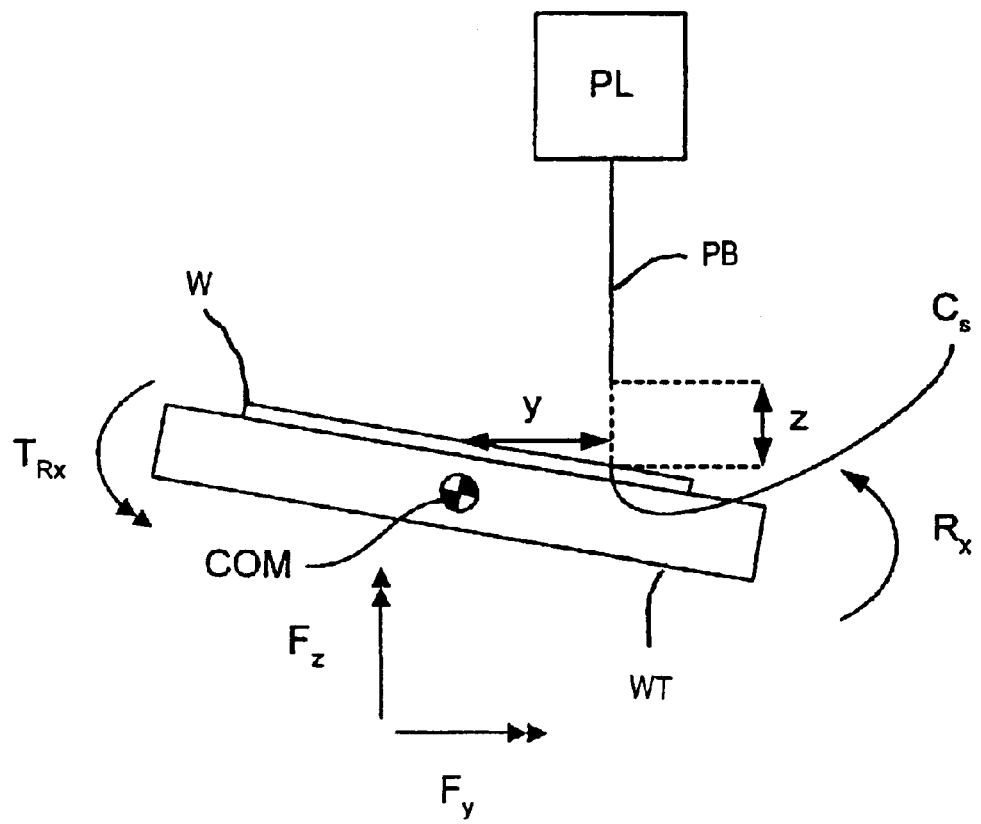
FIG. 3 depicts a substrate on a substrate table.

FIG. 3 depicts a substrate W on a substrate table WT and some co-ordinates that may be used to define the position, velocity and acceleration of the substrate table WT as well as the forces applied to the substrate table WT. The substrate table WT is supported by air mounts or a planar motor. Consequently any torque $T_{Rx}$ applied to the substrate table WT about the X axis will cause it to accelerate about the center of mass COM of the combination of the substrate table WT and the substrate W. The resulting change in the angular position Rx of the substrate table WT will cause an error in the Z position of the targeting region Cs in the Z direction. Therefore adjustments must be made to the force Fz in the Z direction when a torque $T_{Rx}$ is applied to the substrate table WT.

The angular acceleration of an object, in this case the combination of the substrate table WT and the substrate W, is proportional to the torque applied to it. In this case this can be represented as:

$$T_{Rx} = J_{xx} \cdot \ddot{R}_x \qquad (1)$$

where Jxx is the moment of inertia of the combination of the substrate table WT and the substrate W about the X axis and $\ddot{R}_x$ is the angular acceleration.

This angular acceleration $\ddot{R}_x$ causes linear accelerations of regions within the substrate W and substrate table WT. In the present invention the effect of the linear acceleration, in the Z direction, of the targeting region $C_s$ of the substrate on which the projection beam is targeted is determined. As discussed above, the distance z between the targeting region Cs on the substrate W and the projection system PL must remain constant to maintain the focus of the image on the substrate W. The linear acceleration $\ddot{Z}_1$ in the Z direction of the targeting region Cs of the substrate W resulting from the angular acceleration may be determined by:

$$\ddot{Z}_1 = y \cdot \ddot{R}_x \qquad (2)$$

where y is the distance between the center of mass COM of the combination of the substrate table WT and the substrate W and the targeting region Cs of the substrate W in the Y direction.

Furthermore, the combined effect of the linear velocity $\dot{y}$ in the Y (scanning) direction of the targeting region Cs of the substrate W and the angular velocity $\dot{R}_x$ of the substrate W about the X axis produces an additional acceleration $\ddot{Z}_2$ of the targeting region Cs in the Z direction. The linear velocity $\dot{y}$ of the targeting region Cs is not determined directly. The interferometric system IF determines the position and velocity of the substrate W as a whole. The position and velocity of the targeting region Cs can be determined from these measurements by a simple mathematical relationship. The acceleration $\ddot{Z}_2$ may be determined by the following equation:

$$\ddot{Z}_2 = \dot{y} \cdot \dot{R}_x \qquad (3)$$

Finally, the acceleration of the substrate table WT and the substrate W in the Y direction (e.g. at the beginning and end of scans) may also result in an acceleration of the targeting region Cs in the Z direction. This acceleration effect may be determined by the following equation:

$$\ddot{Z}_3 = \ddot{y} \cdot R_x \qquad (4)$$

Therefore, in order to accurately control the position of the targeting region $C_s$ of the substrate W, forces in the Z direction must be applied to the substrate to offset the accelerations $\ddot{Z}_1$, $\ddot{Z}_2$ and $\ddot{Z}_3$ created by the movement of the substrate W. These forces are in addition to the force required to provide the acceleration $\ddot{Z}_s$ required to adjust the position of the substrate W as a whole. The total force Fz that must be applied to the substrate in the Z direction may be determined by:

$$F_Z = m \cdot (\ddot{Z}_S + \ddot{Z}_1 + \ddot{Z}_2 + \ddot{Z}_3) \qquad (5)$$

where m is the combined mass of the substrate table WT and the substrate W.

Depending on the conditions in which the apparatus 1 is operating, some of the terms in the above expression may be negligible and may therefore be dropped to simplify the control system. The forces required to correct the $\ddot{Z}_1$, $\ddot{Z}_2$ and $\ddot{Z}_3$ accelerations may be provided by separate actuators however, more conveniently, a single actuator may be used to provide the total force Fz, the control system being used to determine the total force required. Preferably the forces are provided by a planar motor which can provide all of the forces required to control the substrate table WT in six degrees of freedom.

It will be apparent that the same method and apparatus with suitable modifications may be used to adjust the position of a component in the Z direction as a result of linear movement in the X direction and rotational movement about the Y axis. Correspondingly, the method and apparatus may also be used to adjust the position of the component in the Y direction and in the X direction to compensate for motions along and about the other two axes.

Referring again to FIG. 1, a control unit (controller) CU is operatively connected to the lithographic projection apparatus 1. The control unit CU may be implemented on a programmed general purpose computer. The control unit CU may also be implemented on a special purpose computer, a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA or PAL, or the like. In general, any device, capable of implementing a finite state machine that is in turn capable of implementing the methods described above, can be used to implement the control unit CU.

While specific embodiments of the invention have been described above, it will be appreciated that the invention may be practiced otherwise than as described. The description is not intended to limit the invention.

What is claimed is:

1. A device manufacturing method, comprising:
   providing a substrate that is at least partially covered by a layer of radiation-sensitive material;
   providing a projection beam of radiation using a radiation system;
   using a patterning device to endow the projection beam with a pattern in its cross-section;
   projecting the patterned beam of radiation onto a target portion of the layer of radiation-sensitive material; and
   effecting desired linear accelerations in first and second orthogonal directions and an angular acceleration about an axis perpendicular to the first and second orthogonal directions on a point on a component, wherein effecting the desired linear and angular accelerations comprises:
      determining the positioning forces required to effect the desired accelerations on the center of mass of the component;
      determining a corrective force, the corrective force being in the second orthogonal direction and having a magnitude proportional to the velocity in the first orthogonal direction of the point on the component and the angular velocity of the component about the axis perpendicular to the first and second orthogonal directions; and
      applying the sum of the positioning forces and the corrective force to the center of mass of the component.

2. A device manufacturing method according to claim 1, wherein applying the sum of the positional forces and the corrective force uses a system of actuators, not all of which act through the center of mass, and the forces applied by the system of actuators are such that their sum at the center of mass of the component are equal to the sum of the positional forces and the corrective force.

3. A device manufacturing method according to claim 1, further comprising determining a second corrective force, the second corrective force in the second orthogonal direction with a magnitude proportional to the product of the angular acceleration of the component about the axis perpendicular to the first and second orthogonal directions and the distance in the first orthogonal direction between the center of mass of the component and the point on the component, and applying the sum of the positioning and corrective force includes applying the second corrective force.

4. A device manufacturing method according to claim 3, further comprising determining a third corrective force, the third corrective force in the second direction with a magnitude proportional to the product of the acceleration of the component in the first direction and the angular displacement of the component, about the axis perpendicular to the first and second directions, relative to a predetermined position, and applying the sum of the positioning and corrective force includes applying the third corrective force.

5. A device manufacturing method according to claim 1, wherein the component is a combination of the patterning device and a support structure constructed and arranged to support the patterning device, and the point on the component is an area on the patterning device on which the projection beam is incident.

6. A device manufacturing method according to claim 1, wherein the component is a combination of the substrate and a substrate table constructed and arranged to support the substrate, and the point on the component is an area on the substrate on which the projection beam is incident.

7. A device manufacturing method according to claim 5, wherein the second direction is parallel to the direction of the projection beam.

8. A computer readable medium including a computer program for controlling a lithographic projection apparatus including a component, the computer program comprising:
   first computer program code for effecting desired linear accelerations in first and second orthogonal directions and an angular acceleration about an axis perpendicular to the first and second orthogonal directions on a point on the component, wherein the first computer program code comprises second computer program code for:
      determining the positioning forces required to effect the desired accelerations on the center of mass of the component;
      determining a corrective force, the corrective force being in the second orthogonal direction and having a magnitude proportional to the velocity in the first orthogonal direction of the point on the component and the angular velocity of the component about the axis perpendicular to the first and second orthogonal directions; and
      controlling an actuator system to apply the sum of the positioning forces and the corrective force to the center of mass of the component.

9. A computer readable medium according to claim 8, wherein applying the sum of the positional forces and the corrective force uses the system of actuators, not all of which act through the center of mass, and the forces applied by the system of actuators are such that their sum at the center of mass of the component are equal to the sum of the positional forces and the corrective force.

10. A computer readable medium according to claim 8, wherein the second computer program code further determines a second corrective force, the second corrective force in the second orthogonal direction with a magnitude proportional to the product of the angular acceleration of the component about the axis perpendicular to the first and second orthogonal directions and the distance in the first orthogonal direction between the center of mass of the component and the point on the component, and applying the sum of the positioning and corrective force includes applying the second corrective force.

11. A computer readable medium according to claim 10, wherein the second computer program code further determines a third corrective force, the third corrective force in the second direction with a magnitude proportional to the product of the acceleration of the component in the first direction and the angular displacement of the component, about the axis perpendicular to the first and second directions, relative to a predetermined position, and applying the sum of the positioning and corrective force includes applying the third corrective force.

12. A computer readable medium according to claim 8, wherein the component is a combination of a patterning device and a support structure constructed and arranged to support the patterning device, and the point on the component is an area on the patterning device on which a patterned projection beam is incident.

13. A computer readable medium according to claim 8, wherein the component is a combination of a substrate and a substrate table constructed and arranged to support the substrate, and the point on the component is an area on the substrate on which a projection beam is incident.

14. A computer readable medium according to claim 8, wherein the second direction is parallel to the direction of a patterned projection beam.

15. A lithographic projection apparatus, comprising:
   a radiation system constructed and arranged to provide a projection beam of radiation;
   a support structure constructed and arranged to support a patterning device, the patterning device constructed and arranged to pattern the projection beam according to a desired pattern;
   a substrate table constructed and arranged to hold a substrate;
   a projection system constructed and arranged to project the patterned beam onto a target portion of the substrate;
   a control unit that determines the required forces to effect required linear accelerations in first and second orthogonal directions and a required angular acceleration about an axis perpendicular to the first and second directions on a point on a moveable component within the apparatus; wherein the control unit:
      determines the positioning forces required to effect the desired accelerations on the center of mass of the component;
      determines a corrective force, the corrective force being in the second orthogonal direction and having a magnitude proportional to the velocity in the first orthogonal direction of the point on the component and the angular velocity of the component about the axis perpendicular to the first and second orthogonal directions;
      determines the sum of the positioning force and the corrective force; and
   an actuator system, operatively connected to the control unit, constructed and arranged to apply the sum of forces to the center of mass of the component.

16. An apparatus according to claim 15, wherein the actuator system is a planar motor.

17. An apparatus according to claim 16, wherein applying the sum of the positional forces and the corrective force uses the system of actuators, not all of which act through the center of mass, and the forces applied by the system of actuators are such that their sum at the center of mass of the component are equal to the sum of the positional forces and the corrective force.

18. An apparatus according to claim 15, wherein the control unit further determines a second corrective force, the second corrective force in the second orthogonal direction with a magnitude proportional to the product of the angular acceleration of the component about the axis perpendicular to the first and second orthogonal directions and the distance in the first orthogonal direction between the center of mass of the component and the point on the component, and applying the sum of the positioning and corrective force includes applying the second corrective force.

19. An apparatus according to claim 18, wherein the control unit further determines a third corrective force, the third corrective force in the second direction with a magnitude proportional to the product of the acceleration of the component in the first direction and the angular displacement of the component, about the axis perpendicular to the first and second directions, relative to a predetermined position, and applying the sum of the positioning and corrective force includes applying the third corrective force.

20. An apparatus according to claim 15, wherein the component is a combination of the patterning device and the support structure, and the point on the component is an area on the patterning device on which a projection beam is incident.

21. An apparatus according to claim 15, the component is a combination of the substrate and the substrate table, and the point on the component is an area on the substrate on which a projection beam is incident.

22. An apparatus according to claim 15, wherein the second direction is parallel to the direction of the patterned beam.

* * * * *